(12) United States Patent
Walker

(10) Patent No.: US 7,834,283 B2
(45) Date of Patent: Nov. 16, 2010

(54) PCB MOUNTABLE SWITCH

(75) Inventor: Robert Wayne Walker, Harrisburg, PA (US)

(73) Assignee: Tyco Electronics Corporation, Berwyn, PA (US)

( * ) Notice: Subject to any disclaimer, the term of this patent is extended or adjusted under 35 U.S.C. 154(b) by 547 days.

(21) Appl. No.: 11/567,862

(22) Filed: Dec. 7, 2006

(65) Prior Publication Data
US 2008/0135394 A1 Jun. 12, 2008

(51) Int. Cl.
*H01H 1/44* (2006.01)
(52) U.S. Cl. .................. 200/257; 200/341; 200/532
(58) Field of Classification Search ......... 200/530–536, 200/257, 341
See application file for complete search history.

(56) References Cited

U.S. PATENT DOCUMENTS

| 4,350,855 | A  | * | 9/1982 | Bobb et al. ................. 200/292 |
| 6,288,906 | B1 | * | 9/2001 | Sprietsma et al. ........... 361/772 |

* cited by examiner

*Primary Examiner*—Edwin A. Leon
*Assistant Examiner*—Sean Kayes

(57) ABSTRACT

A switch system for use with a printed circuit board is provided. The switch system includes: a switch base; an anti-overstress member or feature formed in the switch base; a plurality of retention legs formed in the base for retaining a printed circuit board, wherein a first via is in electrical communication with one of the plurality of retention legs; a spring-loaded contact formed in the base for contacting the anti-overstress feature, and wherein a second via is in electrical communication with the spring-loaded contact. A printed circuit board may be mounted in and attached to the plurality of retention legs.

6 Claims, 3 Drawing Sheets

PCB MOUNTABLE SWITCH

BACKGROUND OF THE INVENTION

The present invention relates in general to switches used on or in association with electrical devices, and more specifically to electrical switches that are mountable on electrical components such as printed circuit boards (PCBs).

In electronics, PCBs are used to mechanically support and electrically connect electronic components using conductive pathways, or traces, etched from copper sheets laminated onto a non-conductive substrate. Alternative names are printed wiring board or PWB or etched wiring board. After populating the board with electronic components, a printed circuit assembly (PCA) is formed. PCBs are rugged, inexpensive, and can be highly reliable. They require much more layout effort and higher initial cost than either wire-wrapped or point-to-point constructed circuits, but are much cheaper, faster, and consistent in high volume production. PCBs are widely used in the electronics industry in a variety of products including computers, servers, televisions and telecommunication devices.

PCBs are utilized to operate and/or control various electronic devices; thus, there are certain applications where completing and/or breaking a circuit is desirable. Currently available miniaturized switches typically include multiple components and/or subcomponents. The use of these switches may introduce complexity, cost, and unreliability into electronic systems that include such switches. Thus, there is an ongoing need for an inexpensive, reliable switch that is compatible with PCBs and PCB technology.

SUMMARY OF THE INVENTION

The following provides a summary of exemplary embodiments of the present invention. This summary is not an extensive overview and is not intended to identify key or critical aspects or elements of the present invention or to delineate its scope. The present invention relates to a miniaturized switch for use with electronic components or similar devices and reduces the parts count associated with current PCB mountable switches by providing a unitary switch body that includes all of the basic functionality of prior art switches.

In accordance with one aspect of the present invention, a switch system for use with a printed circuit board is provided. This switch system includes: a switch base; an anti-overstress feature formed in the switch base; a plurality of retention legs formed in the base for retaining a printed circuit board, wherein at least one via is in electrical communication with at least one of the plurality of retention legs; a spring-loaded contact formed in the base for contacting the anti-overstress feature, wherein another via is in electrical communication with the spring-loaded contact; and a printed circuit board mounted in the plurality of retention legs.

In accordance with another aspect of the present invention, a miniature switch for use with a printed circuit board is provided. This switch includes: a switch base; an anti-overstress feature formed in the switch base; a plurality of retention legs formed in the base for retaining a printed circuit board; and a spring-loaded contact formed in the base for contacting the anti-overstress feature.

In yet another aspect of this invention, a method for breaking the hot or ground circuit on a printed circuit board is provided. This method includes: providing a switch system for use with a printed circuit board, wherein the switch system further includes: a switch base; an anti-overstress feature formed in the switch base; a plurality of retention legs formed in the base for retaining a printed circuit board, wherein at least one via is in electrical communication with at least one of the plurality of retention legs; a spring-loaded contact formed in the base for contacting the anti-overstress feature, wherein a via is in electrical communication with the spring-loaded contact; and a printed circuit board mounted in the plurality of retention legs; and eliminating physical contact between the spring loaded contact and the anti-overstress feature.

Additional features and aspects of the present invention will become apparent to those of ordinary skill in the art upon reading and understanding the following detailed description of the exemplary embodiments. As will be appreciated by the skilled artisan, further embodiments of the invention are possible without departing from the scope and spirit of the invention. Accordingly, the drawings and associated descriptions are to be regarded as illustrative and not restrictive in nature.

BRIEF DESCRIPTION OF THE DRAWINGS

The accompanying drawings, which are incorporated into and form a part of the specification, schematically illustrate one or more exemplary embodiments of the invention and, together with the general description given above and detailed description given below, serve to explain the principles of the invention, and wherein.

DETAILED DESCRIPTION OF THE INVENTION

Figure 1:
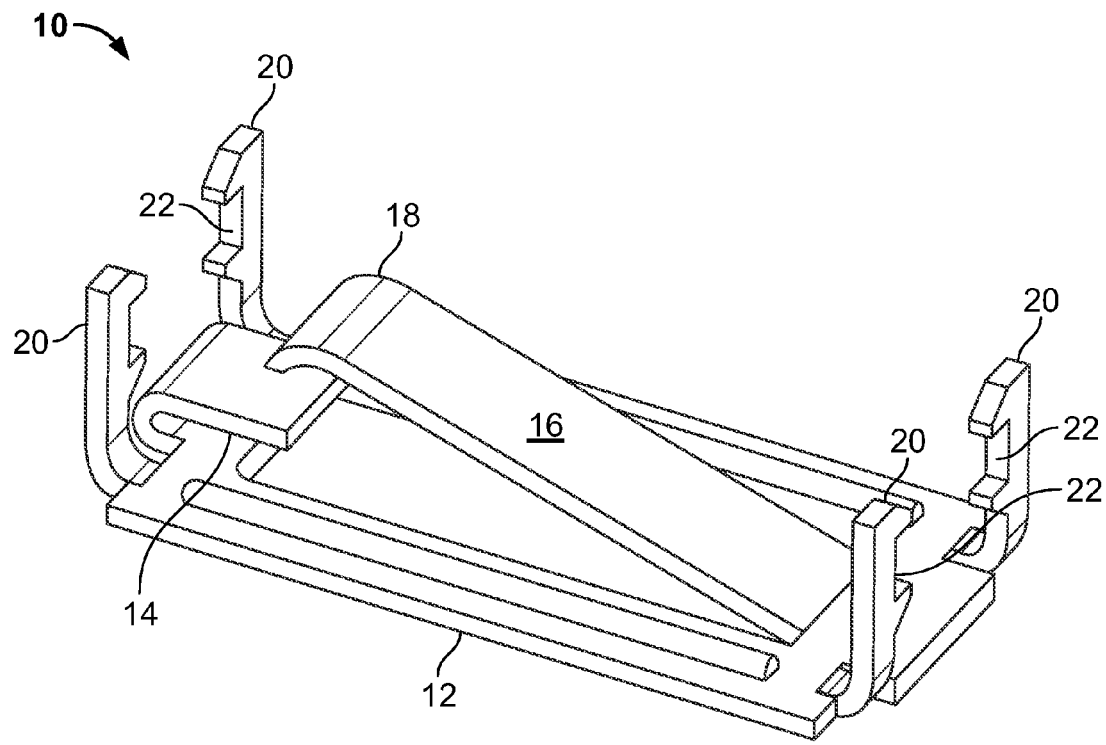
FIG. 1 is a rear perspective view of an exemplary embodiment of the PCB mountable switch of the present invention.
Figure 2:
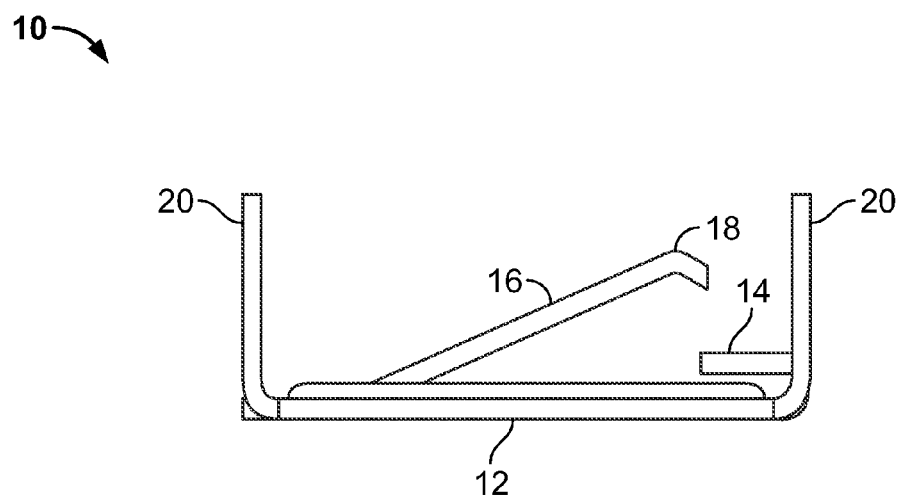
FIG. 2 is a side view of the PCB mountable switch of FIG. 1.
Figure 3:
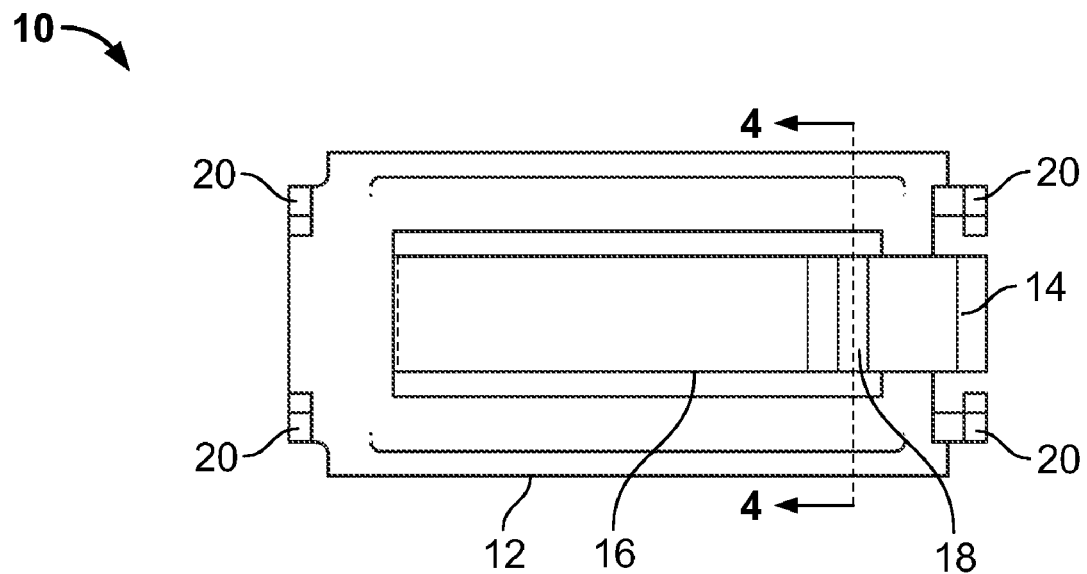
FIG. 3 is a top view of the PCB mountable switch of FIG. 1.
Figure 4:
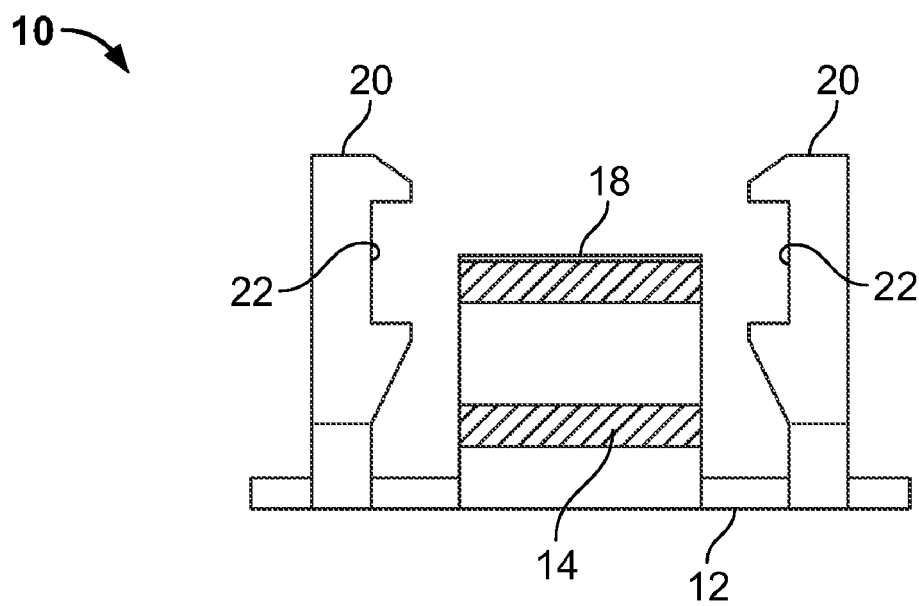
FIG. 4 is a front view of the PCB mountable switch of FIG. 1.

Exemplary embodiments of the present invention are now described with reference to the Figures. Reference numerals are used throughout the detailed description to refer to the various elements and structures. In other instances, well-known structures and devices are shown in block diagram form for purposes of simplifying the description. Although the following detailed description contains many specifics for the purposes of illustration, anyone of ordinary skill in the art will appreciate that many variations and alterations to the following details are within the scope of the invention. Accordingly, the following embodiments of the invention are set forth without any loss of generality to, and without imposing limitations upon, the claimed invention.

In general terms, the present invention relates to a miniaturized, cost-effective switch for use with electronic components or similar devices, wherein the construction of the switch is "unitary" in that the components of the switch are typically manufactured from a single piece of material. The exemplary embodiment shown in the Figures provides a switch system for use with printed circuit boards. This switch system typically includes a switch base; an anti-overstress feature formed in the switch base; a plurality of retention legs formed in the base for retaining a printed circuit board, wherein a first via is in electrical communication with one of the plurality of retention legs; a spring-loaded contact formed in the base for contacting the anti-overstress feature, wherein a second via is in electrical communication with the spring-loaded contact; and a printed circuit board mounted in the plurality of retention legs. In printed circuit board design, the term via refers to a pad with a plated hole that connects copper tracks from one layer of the board to other layer(s). Either the holes are electroplated or small rivets are inserted.

With reference now to the Figures, FIGS. 1-4 provide various views of an exemplary embodiment of switch 10, which may be formed from a single piece of material such as brass, steel, phosphor-bronze, copper, aluminum, alloys thereof or combinations thereof. Switch 10 includes switch base 12, anti-overstress feature 14, and switch spring or biased contact beam 16, which includes terminus 18. Anti-over stress feature 14, which is typically biased upward, functions as an integrated contact stop for preventing an operator or a faulty test jig (see below) from over-bending contact beam 16 and causing a loss of normal force at the contact interface between switch components. In this embodiment, four retention legs 20 are formed on switch base 12, and each retention leg includes a notch 22 for accepting the edge of a printed circuit board.

Figure 5:
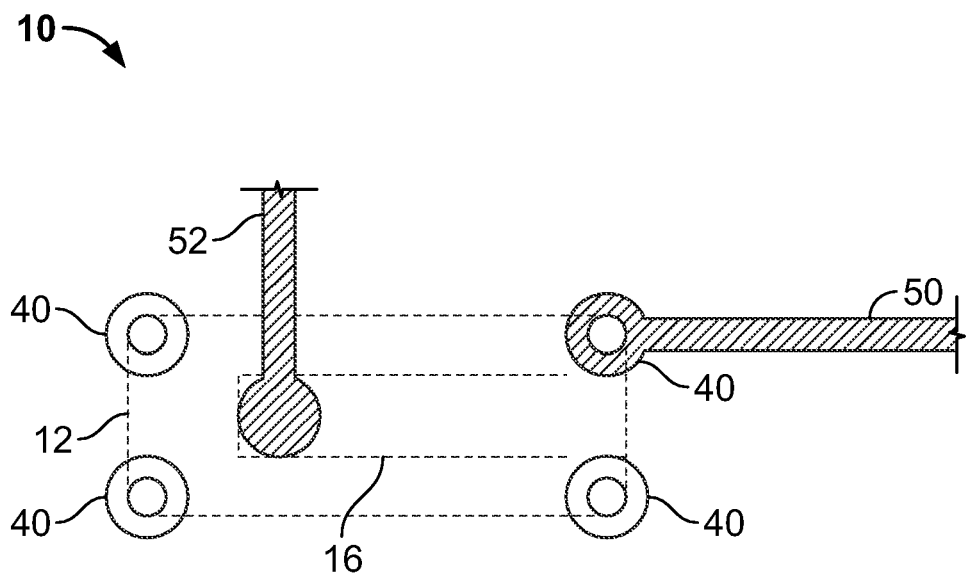
FIG. 5 is a highly simplified electrical schematic of the PCB mountable switch of FIG. 1.
Figure 6:
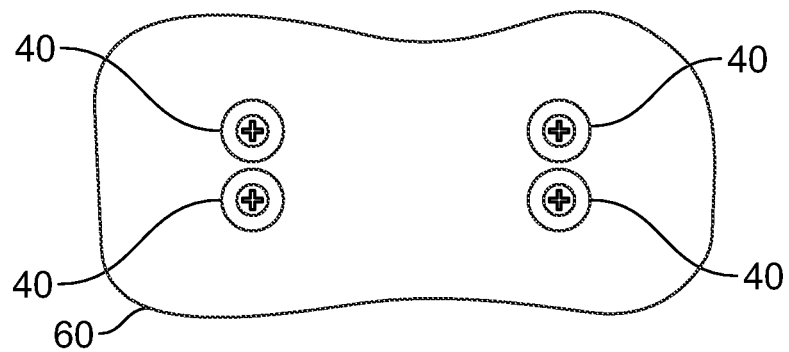
FIG. 6 is a highly simplified representation of the layout of a typical PCB usable in combination with the PCB mountable switch of FIG. 1.

FIG. 5 provides a simplified schematic of an exemplary electrical configuration that includes switch 10. Switch 10 is designed to break the "hot" or "ground" circuit on a PCB. When one of the retention legs 20 is electrically connected (e.g., soldered) to via 50, continuity is maintained by contact 16 pressing on plated via 52. When contact 16 is lifted off via 52, electrical contact between contact 16 and via 52 is lost and the circuit is broken; thus switching part or all of the PCB or a component attached to the PCB, "off". An exemplary printed circuit board 60, having four possible connection points 40 is shown in FIG. 6. Retention legs 20 pass through board 60 and latch thereto at connection points 40.

In one application, switch 10 is used to test a PCB during the manufacturing process while the PCB assembly is still on the production line. Switch 10 serves as a power disconnect so that individual board functions may be electronically isolated and checked without having to remove the PCB assembly from the production line. Typically, switch 10 is activated automatically as a PCB assembly is placed into a test jig, which is usually located on the production line. In the exemplary embodiment shown in FIG. 5, via 50 is connected to one of the four retention legs for the purpose of testing one functional aspect of the PCB. In other embodiments of this invention, additional vias may be attached to one or more of the remaining retention legs 20 for the purpose of simultaneously testing other functional aspects of the PCB upon which switch 10 has been included. When multiple vias are attached to the retention legs on switch 10, breaking the circuit as described above will simultaneously disconnect all board functions and/or devices connected to the switch.

While the present invention has been illustrated by the description of exemplary embodiments thereof, and while the embodiments have been described in certain detail, it is not the intention of the Applicant to restrict or in any way limit the scope of the appended claims to such detail. Additional advantages and modifications will readily appear to those skilled in the art. Therefore, the invention in its broader aspects is not limited to any of the specific details, representative devices and methods, and/or illustrative examples shown and described. Accordingly, departures may be made from such details without departing from the spirit or scope of the applicant's general inventive concept.

What is claimed:

1. A testing device for use with a printed circuit board, comprising:
   (a) a base;
   (b) an upwardly biased, spring-loaded contact integrally formed with the base, wherein the spring loaded contact further includes a terminus, wherein the terminus is adapted to make electrical contact with a first via upon insertion into the printed circuit board, and wherein the first via is a component of a printed circuit board to be tested;
   (c) an anti-overstress feature integrally formed in the base, wherein the anti-overstress feature is adapted to operate as an integrated contact stop for the terminus and is adapted to prevent over-bending of the spring-loaded contact in a direction opposite its normal bias upon insertion into the printed circuit board; and
   (d) a plurality of retention legs integrally formed with the base for retaining the testing device in the printed circuit board, wherein each of the retention legs is adapted make electrical contact with additional vias, and wherein each of the additional vias contacted by one of the retention legs is a component of the printed circuit board to be tested; and
   (e) wherein contacting the first via with the terminus of the spring-loaded contact while at least one of the additional vias is in electrical contact with at least one of the retention legs completes an electrical circuit, and wherein removing the first via from contact with the terminus of the spring-loaded contact while at least one of the additional vias is in electrical contact with at least one of the retention legs breaks an electrical circuit.

2. The testing device of claim 1, wherein the material is brass, steel, phosphor-bronze, or combinations thereof.

3. The testing device of claim 1, wherein each of the retention legs further includes a notch formed therein for securing a printed circuit board.

4. A method for testing a printed circuit board, comprising:
   (a) providing a testing device for use with at least one of the hot circuit or ground circuit on a printed circuit board, wherein the testing device further includes:
      (i) a base;
      (ii) an upwardly biased, spring-loaded contact integrally formed with the base, wherein the spring loaded contact further includes a terminus, wherein the terminus is adapted to make electrical contact with a first via upon insertion into the printed circuit board, and wherein the first via is a component of the printed circuit board to be tested;
      (iii) an anti-overstress feature integrally formed in the base, wherein the anti-overstress feature is adapted to operate as an integrated contact stop for the terminus and is adapted to prevent over-bending of the spring-loaded contact in a direction opposite its normal bias upon insertion into the printed circuit board; and
      (iv) a plurality of retention legs integrally formed with the base for retaining the testing device in the printed circuit board, wherein each of the retention legs is adapted make electrical contact with additional vias, and wherein each of the additional vias contacted by one of the retention legs is a component of the printed circuit board to be tested; and
   (b) contacting the first via with the terminus of the spring-loaded contact while at least one of the additional vias is in electrical contact with at least one of the retention legs to complete an electrical circuit; and
   (c) removing the first via from contact with the terminus of the spring loaded contact while at least one of the additional vias is in electrical contact with at least one of the retention legs to break an electrical circuit.

5. The method of claim 4, wherein the material is brass, steel, phosphor-bronze, or combinations thereof.

6. The method of claim 4, wherein each of the retention legs further comprises a notch formed therein for securing a printed circuit board.

* * * * *